United States Patent
Allen et al.

(10) Patent No.: US 6,547,571 B2
(45) Date of Patent: Apr. 15, 2003

(54) LOW COST, HIGH PERFORMANCE FLEXIBLE TESTER HANDLER DOCKING INTERFACE

(75) Inventors: David Lawrence Allen, Campbell, CA (US); Edmon Quinto Dimla, San Jose, CA (US); Dainuri Paul Rott, Palo Alto, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/886,532

(22) Filed: Jun. 21, 2001

(65) Prior Publication Data

US 2002/0197892 A1 Dec. 26, 2002

(51) Int. Cl.[7] .............................................. H01R 12/00
(52) U.S. Cl. ........................................... 439/74; 439/74
(58) Field of Search ............................ 439/74, 66, 91; 324/754, 758, 158.1

(56) References Cited

U.S. PATENT DOCUMENTS

| 5,018,836 A | 5/1991 | Noda et al. .................. 350/247 |
| 5,751,518 A | 5/1998 | Konno et al. ............... 360/104 |
| 5,828,223 A | 10/1998 | Rabkin et al. .............. 324/754 |
| 6,168,459 B1 | 1/2001 | Cox et al. .................... 439/495 |

Primary Examiner—P. Austin Bradley
Assistant Examiner—Alexander Gilman
(74) Attorney, Agent, or Firm—Perkins Coie LLP

(57) ABSTRACT

The present invention is related to a method and apparatus of securing and testing an IC or similar device, in which the connection of the IC is achieved through the use of a handler PCB and dual "Outrigger" PCBs connected to a test head via "flex joints". More specifically, the present invention discloses a method and apparatus to flexibly dock a handler PCB containing a device under test to a test head through the use of dual Outrigger PCBs capable of flexible movement allowing alignment between high performance electrical connectors on the handler PCB and the Outrigger PCBs, eliminating stress due to misalignments and vibration transmission during testing.

19 Claims, 5 Drawing Sheets

LOW COST, HIGH PERFORMANCE FLEXIBLE TESTER HANDLER DOCKING INTERFACE

BACKGROUND OF INVENTION

1. Field of Invention

The present invention is related to electronic device test fixture component design and operation required during the test phase of electronic device manufacturing. More specifically, the present invention relates to the method and apparatus for the "flexible" docking of a handler, containing a high performance contactor and device under test, with a test head, using dual "Outrigger" printed circuit boards electromechanically coupled to the test head via flexible supports reducing component stress and vibration.

2. Description of Related Art

Performance of final testing on packaged parts requires the electrical connection of two large electromechanical components, the ATE (automatic test equipment) test head and the device handler. Because of the large variety of testers and the large number of different package types, test heads and handlers come in a large variety of shapes and sizes. There are currently two methods used for coupling these two components, "hard" docking and "soft" docking.

Hard docking requires the production of precise, often bulky, mechanical components to physically lock the handler to the test head. Typical components include the test head manipulator, test head docking plate, handler docking plate, alignment "bar", guide pins, cam and/or vacuum lock to physically couple the test head to the handler. These items are expensive and often must be customized for each test head and handler type. Furthermore, setup requirements may result in extensive component changes when handler type A is switched to test head type B or handler type B is changed to test head type A.

In addition, every time test heads and handlers are docked, the mechanical alignment of the components needs to be checked. Although this prior art method results in a very secure connection of the two components and ensures high integrity signals to the device under test, the method has higher costs, skill and maintenance demands for production. The prior art method also exhibits poor visibility for components and difficult or expensive compatibility issues.

Another method used for coupling test heads and handlers is soft docking. In soft docking, the test head and the handler are connected by a simple male and female connector, usually a male edge-type connector on the handler and a female edge-type connector on the test head. Using the test head manipulator, the male and female connectors are joined by test floor operators after manually moving the components into alignment. The soft docking method benefits from low cost and simplicity, however the edge-type connectors often do not provide a high integrity AC signal path to the device under test, especially at frequencies above 10 MHz. In addition, since there is no mechanical connection between the test head and handler, any stresses in the soft docking process can result in damage or wear to the edge connectors and excessive stress on the mechanical assemblies which hold the connectors in place. This method is especially vulnerable to stress damage since there is nothing to take up the mechanical stress if the test head or handler is accidentally moved while the two components are docked.

Several flexible alignment solutions to these problems have been considered. In the prior art U.S. Pat. No. 5,828, 223, issued Oct. 27, 1998 to Rabkin et al., vertical posts which allow a degree of float between a housing plate and loadboard are disclosed. In the prior art example however, the float between loadboard and housing plate is required to avoid disturbance to the test head when the chip handler is pneumatically clamped into place. The one-piece housing plate supported by the vertical posts as disclosed in the prior art is still much too rigid and fails to produce the flexible alignment and stress prevention required for docking and testing many devices. Stress on connectors in this prior art solution may actually be increased by the use of a one-piece plate in cases where alignments at one point may create misalignments at other points. Furthermore, the flex posts used to support the one-piece plate in the prior art lack any means to prevent overtravel between housing plate and loadboard. Connectors may be subject to damage unless alternate travel restrictions are used to limit the clamping force used to bring the components together.

Therefore what is needed is a method and apparatus to quickly and effectively dock the test head with a large variety of handler types while suppressing component stress damage. The new method should also achieve the best signal path possible between the test head and the device under test.

BRIEF SUMMARY OF THE INVENTION

It is the object of the present invention to create a method and apparatus which may be used for the "flexible" docking of a test head and handler which is broadly adapted to a large variety of test heads and handlers, allowing rapid and reliable setup changes for maximum production efficiency. In so doing, frequent and expensive setup changes may be eliminated or greatly reduced. In addition, another object of the present invention is a flexible docking method and apparatus which minimizes stress on components (and is therefore more "production worthy") while achieving the best possible signal path between the test head and the device under test.

The present invention discloses a method and apparatus to achieve flexible docking while avoiding the expense of hard docking and many of the performance limitations of soft docking. Through the use of high-performance, high-integrity electrical connectors instead of edge-type connectors, and dual printed circuit board "Outriggers" capable of alignment through the use of flexible supports and offset guide pins, the present invention protects the high performance connectors and all mechanical components from damage during docking. Stress-free alignment of the dual Outriggers is accomplished through the use of a robust, inexpensive keyed guide pin system and flexible joints, which also absorb mechanical stresses preventing damage to sensitive mechanical and electrical components during testing.

With the present invention, no expensive hard docking components are required to couple test head and handler, and no hard docking compatibility issues exist. Because of the flexible joint, it is possible to dock a test head and handler that could not be docked with a hard docking solution without expensive mechanical modifications and additions, such as changing the test head manipulator. Relatively inexpensive components combine for a reliable, production worthy, docking solution.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

DETAILED DESCRIPTION OF PRESENTLY PREFERRED EXEMPLARY EMBODIMENTS

The present invention provides an improved method and apparatus to dock a handler and test head through the use of dual "Outrigger" printed circuit boards (PCBs) capable of flexible movement, allowing alignment between high performance electrical connectors on the handler and the Outriggers. The apparatus of the present invention includes the handler interface PCB, the left and right independent Outrigger PCBs, and a test head PCB. During the final operation, the handler interface PCB is mechanically attached to the handler, and the test head PCB is mechanically attached to the test head. In both cases, the integrity of the electrical signal is maintained. The handler PCB contains a high performance contactor which holds the device under test in place during testing. The device under test (DUT) may consist of a variety of package and component configurations, with different high performance contactors for each package type and different contactor PCBs for each package type and nonequivalent device type. Both AC and DC connections to the DUT are made through the use of two high performance electrical connectors and both AC and DC signal tracings on the handler PCB. Electrical test connections are completed through multiple controlled impedance AC cables and DC signal path conductors between the high performance electrical connectors on the dual Outriggers and the test head.

Figure 1A:
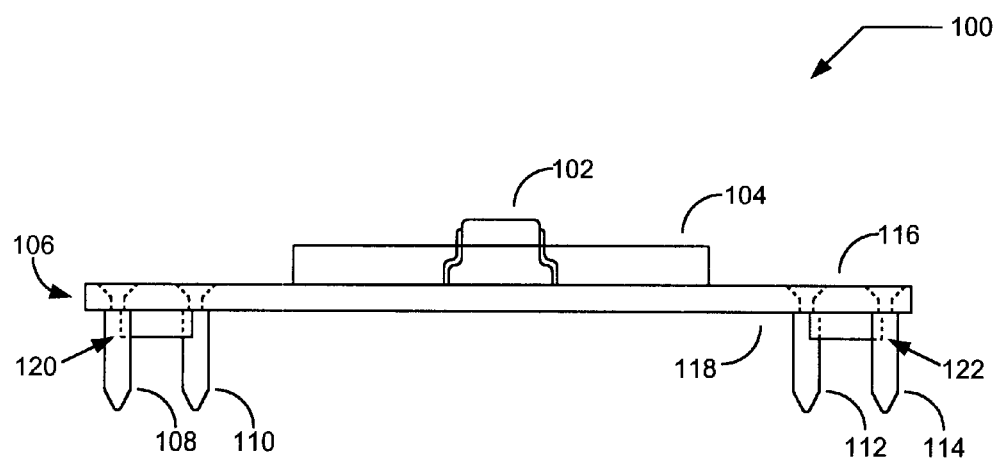
FIG. 1A illustrates a side view of the contactor mechanically attached to the handler PCB containing the offset guide pins.
Figure 1B:
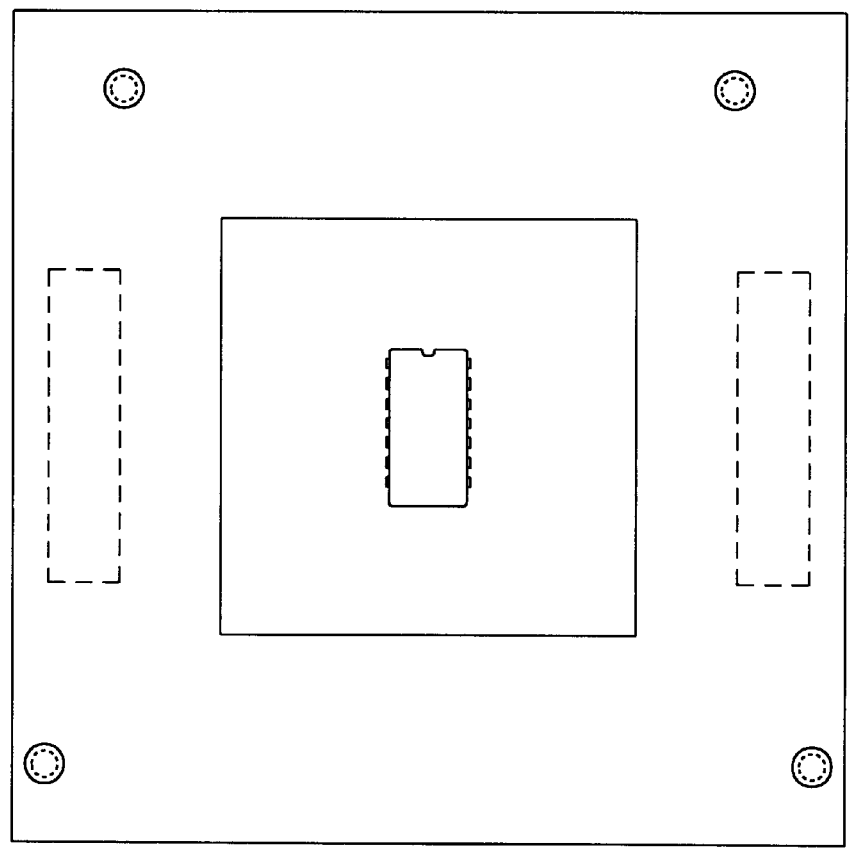
FIG. 1B illustrates a top view of the contactor mechanically attached to the handler PCB containing the offset guide pins.

In FIG. 1A, diagram 100 shows a side view of the contactor 104 which is mechanically attached to the handler PCB 106. The DUT 102 is placed on the high performance contactor 104 by a handler "plunge" mechanism (not shown). The high performance contactor 104 is used to electrically couple the DUT 102 and the handler PCB 106. Mechanical alignment is accomplished by the handler plunge mechanism, accurately placing the DUT on the contacting mechanism of the high performance contactor 104. This high performance contactor 104 may be of any type suitable for use with the DUT package type under test, such as Johstech® or Primeyield® contactors, and is mechanically and electrically coupled to the first side 116 of the handler PCB 106.

The handler PCB 106 contains both AC and DC signal traces and is made up of typical PCB components of a size and thickness suitable for testing the DUT configuration. In addition, it may contain test interface components such as resistors, capacitors, integrated buffer circuits and relays. The handler PCB 106 also includes four offset guide pins 108, 110, 112 and 114, which are mechanically attached to the corners of the second side 118 of the handler PCB 106. The guide pins are "keyed", or offset, such that orientation of the handler PCB 106 may be determined from guide pin position. Furthermore, the keyed guide pins insure the handler PCB will be in the correct position during testing, preventing damage to the docking components due to improper connections. The guide pins are made of any lightweight wear-resistant material such as aluminum, and end with a tapered point allowing rapid alignment when inserted into corresponding guide pin receptacles.

Two high performance electrical connectors 120 and 122, such as Hypertronics®, are mechanically and electrically attached to the second side 118 of the handler PCB 106. The high performance electrical connector 120 is positioned to one side of the DUT for ease of connection to DUT pins typically numbered 1–7, and is electrically coupled to the DUT via contactor 104 and signal tracings on the handler PCB 106. A second high performance electrical connector 122 is positioned on the opposite side of the DUT for ease of connection to DUT test pins typically numbered 8–14 and is electrically coupled to the DUT via contactor 104 and signal tracings on the handler PCB 106.

The handler PCB 106 containing the attached DUT 102 may now be moved and positioned for testing. Testing the DUT 102 requires the handler PCB 106 to be docked with the test head PCB 204, shown in FIG. 2A, with proper alignment of components such that component stress is minimized and sufficient electrical connection is achieved. This "flexible" docking is accomplished through the use of dual Outrigger PCBs shown in diagram 200 in FIG. 2A and diagram 300 in FIG. 3A. The dual Outrigger PCBs 202 and 302 are located at opposite sides of the test head PCB 204 and each contain a high performance electrical connector 220 and 320 which correspond to the handler high performance electrical connectors 120 and 122 respectively. The offset guide pins 108, 110, 112 and 114, and the offset guide pin receptacles 214, 216, 314 and 316, align the handler PCB and dual Outrigger PCBs insuring a proper connection between high performance electrical connectors 120 and 220, and high performance electrical connectors 122 and 320. The offset, or keyed, guide pins ensure the handler and dual Outriggers engage in one position only, preventing damage to the device under test due to improper connections.

Figure 2A:
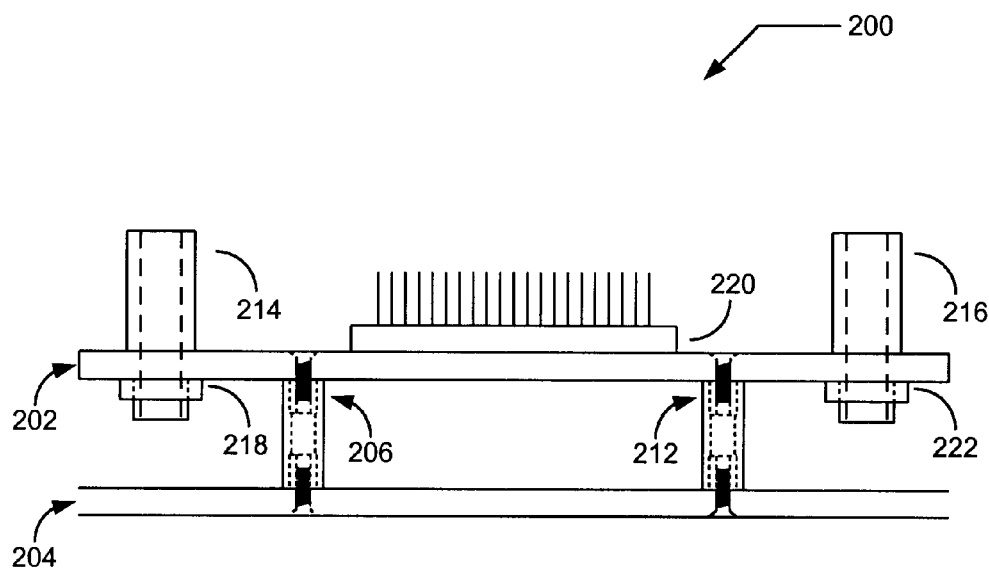
FIG. 2A illustrates a side view of an embodiment of a left Outrigger PCB, illustrating the flex joint flexible mechanical supports and guide pin receptacles.
Figure 2B:
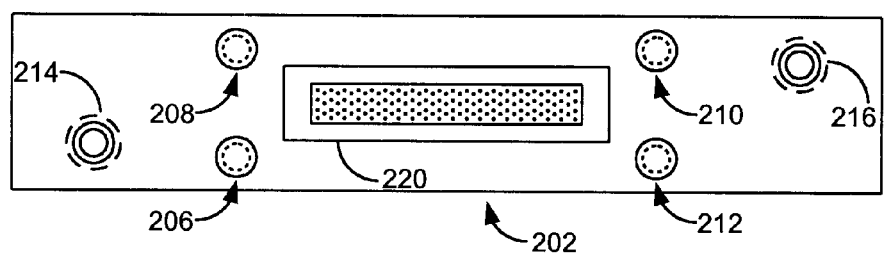
FIG. 2B illustrates a top view of an embodiment of a left Outrigger PCB, illustrating the flex joint flexible mechanical supports and guide pin receptacles.

FIGS. 2A and 2B present side and top views respectively, of the Outrigger PCB 202 located on the left of the test head PCB. In diagram 200 of FIG. 2A, the Outrigger PCB 202 is shown mechanically attached to the test head PCB 204 via "flex joint" supporters 206, 208, 210 and 212. The Outrigger PCB 202 is also shown with dual offset guide pin receptacles 214 and 216. Each guide pin receptacle has an inside diameter sufficient for the secure insertion of a guide pin and is fabricated out of Nylon or a similar material to minimize friction between guide pin and receptacle upon insertion of the tapered pin. The guide pin receptacles are shown mechanically attached to opposite ends of the Outrigger PCB 202, and are sufficiently offset to allow engagement with the handler PCB in only one position. The keyed guide pins ensure the handler PCB 106 and the left Outrigger PCB 202 will only engage in one position, preventing damage to the DUT due to improper connections of the high performance electrical connectors 120 and 220, as well as preventing the improper connection of connectors 120 and 320. The guide pin receptacles are of a sufficient length to allow secure connection to the Outrigger PCB 202 while successfully aligning the guide pins before the high performance electrical connectors 120 and 220 engage, insuring the high performance electrical connectors will not be required to align themselves.

Figure 3A:
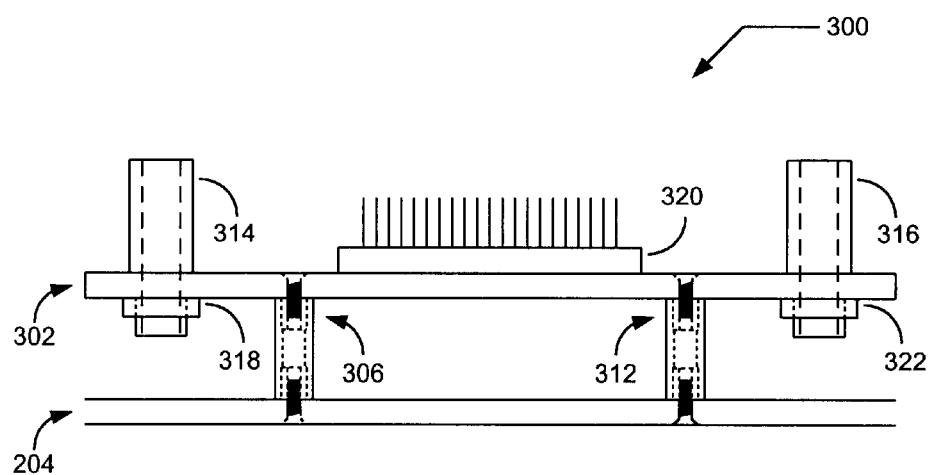
FIG. 3A illustrates a side view of an embodiment of a right Outrigger PCB, illustrating the flex joint flexible mechanical supports and guide pin receptacles.
Figure 3B:
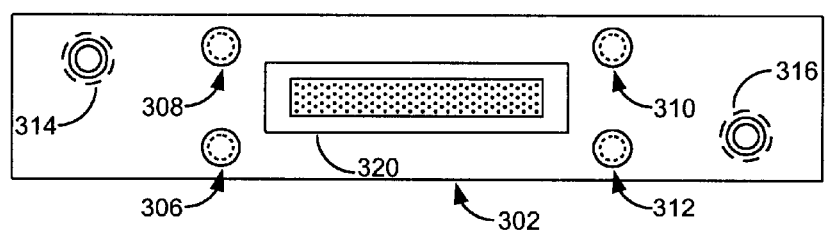
FIG. 3B illustrates a top view of an embodiment of a right Outrigger PCB, illustrating the flex joint flexible mechanical supports and guide pin receptacles.

In a similar fashion, FIGS. 3A and 3B present side and top views respectively, of the Outrigger PCB 302 located on the right of the test head PCB. In diagram 300 of FIG. 3A, the Outrigger PCB 302 is shown mechanically attached to the test head PCB 204 via flex joint supporters 306, 308, 310 and 312. The Outrigger PCB 302 is also shown with dual offset guide pin receptacles 314 and 316. Each guide pin receptacle has an inside diameter sufficient for the secure insertion of a guide pin and is fabricated out of Nylon or a similar material to minimize friction between guide pin and receptacle upon insertion of the tapered guide pin. The guide pin receptacles are shown mechanically attached to opposite ends of the Outrigger PCB 302, and are sufficiently offset to allow engagement with the handler PCB in only one position. As with the left Outrigger PCB, the keyed guide pins insure the handler PCB 106 and the right Outrigger PCB 302 will only engage in one position, preventing damage to the DUT due to improper connections of the high performance electrical connectors 122 and 320, as well as preventing the improper connection of connectors 122 and 220. The guide pin receptacles are of a sufficient length to allow secure connection to the Outrigger PCB 302 while successfully aligning the guide pins before the high performance electrical connectors 122 and 320 engage.

Guide pin receptacle connection to the Outrigger PCB 202 is accomplished by positioning a hole in the Outrigger PCB 202 and cutting a shoulder onto the guide pin receptacle 214 such that upon insertion of the guide pin receptacle reduced diameter end into the hole, the shoulder is of sufficient outside diameter to prevent the guide pin receptacle from completely passing through the opening. The reduced diameter end of the guide pin receptacle is then threaded such that a clamp nut 218 may be securely screwed onto the reduced diameter end completely to the shoulder. The guide pin receptacle 214 may then be mechanically attached to the Outrigger PCB 202 by inserting the threaded reduced diameter end into the opening prepared for the guide pin receptacle and securely screwing the clamp nut 218 onto the reduced diameter end until the shoulder and clamp nut are drawn tightly against the Outrigger PCB 202. This procedure is repeated for each guide pin receptacle 214 and 216 on Outrigger PCB 202, and for each guide pin receptacle 314 and 316 on Outrigger PCB 302.

"Flexible" docking and undocking is performed by simply bringing together and separating the handler PCB 106 and the test head PCB 204 while allowing the guide pins and guide pin receptacles to align the dual Outrigger PCBs with the high performance electrical connectors 120 and 122 on the handler PCB. The handler and test head may be brought together manually or through the use of hydraulic, pneumatic, electrical or mechanical movement devices (not shown). These devices may consist pistons, servomotors or slides in any combination allowing the operator to join the handler and test head.

Alignment of the dual Outrigger PCBs is accomplished through the use of "flex joint" mechanical connections between the dual Outrigger PCBs and the test head PCB, which allow movement of the dual Outrigger PCBs during docking. Slight positioning and fixture inaccuracies of the handler as well as docking stresses due to these inaccuracies are all relieved by the rubber flex joints, while the electrical signals between test head PCB and Outrigger PCBs remain undisturbed, carried by flexible cables and wires between the test head PCB and the Outrigger PCBs high performance electrical connectors. Vibration between test head PCB and handler PCB is also eliminated through the flex joint mechanical connection between Outrigger PCBs and test head PCB.

The flex joints 206, 208, 210 and 212 are shown in diagram 200 in FIG. 2A, and flex joints 306, 308, 310 and 312 are shown in diagram 300 of FIG. 3A. Each Outrigger PCB 202 and 302 is mechanically coupled to the test head PCB 204 via four flex joints 206, 208, 210, 212, and 306, 308, 310 and 312 respectively. The four flex joints for each Outrigger 202 and 302 are positioned at each corner of the Outrigger PCB respectively, to insure the Outrigger PCB is held flat and in position during docking with the handler PCB without twisting or warping. In FIG. 2A the flex joints are shown mechanically coupling the left Outrigger PCB 202 to the test head PCB 204, and in a like fashion, in FIG. 3A the flex joints are shown mechanically coupling the right Outrigger PCB 302 to the test head PCB 204.

Figure 4:
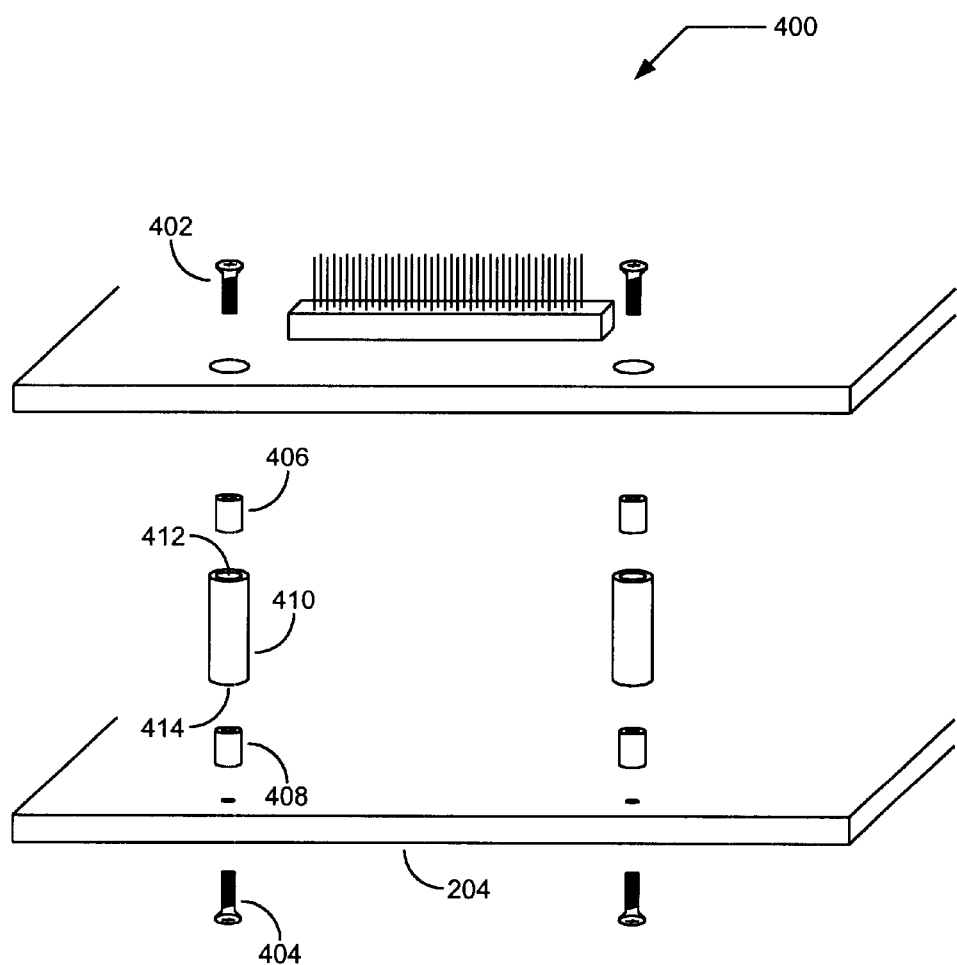
FIG. 4 illustrates an embodiment of the flex joint flexible mechanical support.
Figure 5:
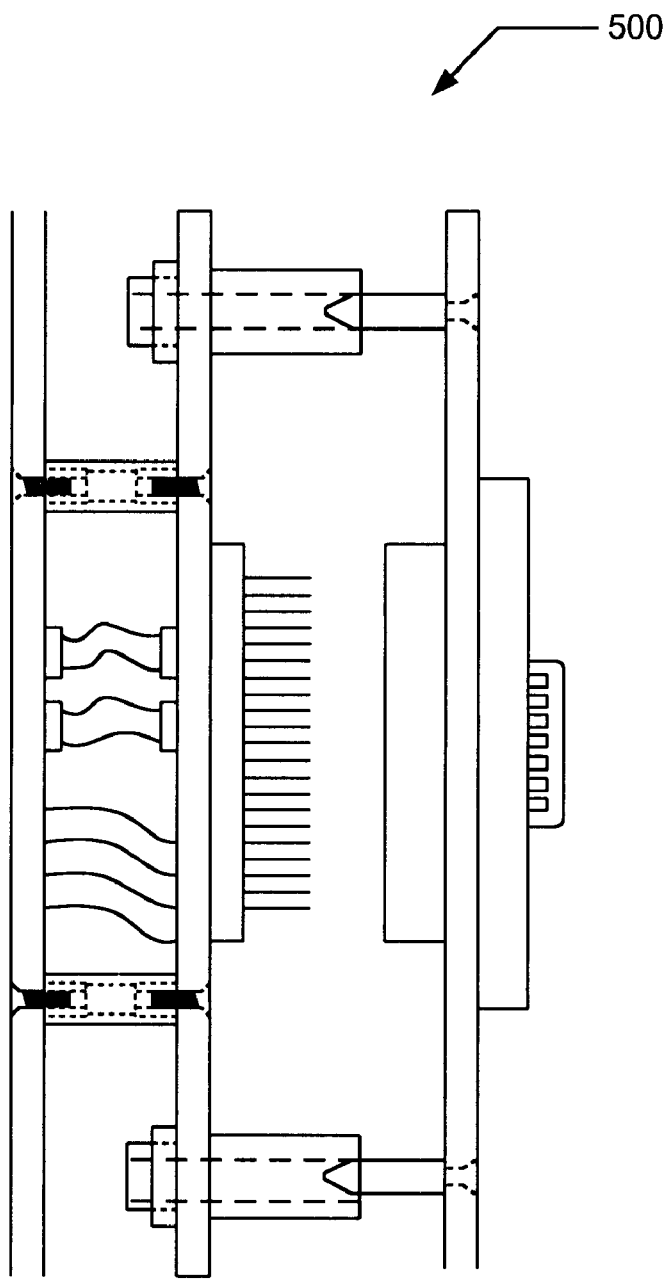
FIG. 5 illustrates the test head docking process, demonstrating the flex joint and keyed guide pins.

The flex joint is shown in detail in diagram 400 in FIG. 4 and includes a first and second threaded fastening device 402 and 404, a first and second threaded stand off 406 and 408, and a cylindrical rubber intermediate piece 410. The flex joints are used to mechanically attach the Outrigger PCB 202 and 302 to the test head PCB 204, creating a secure connection capable of movement, allowing handler and Outrigger alignment to occur through guide pin and receptacle engagement. The intermediate piece 410 has a first and second opening 412 and 414 and the first threaded standoff is securely inserted into the first opening 412 and the second threaded standoff is securely inserted into the second opening 414. The overall length of the intermediate piece 410 is long enough to provide a gap between the first threaded standoff 406 and the second threaded standoff 408 which is bridged by the intermediate piece. During the docking process, the spacing between Outriggers 202 and 302 and the test head PCB 204 is limited and set by the gap between threaded standoff components 406 and 408. As the intermediate piece 410 is deflected more and more during docking and the gap is closed, contact between components 406 and 408 will prevent Outriggers 202 or 302 from striking the test head PCB 204. Contact between 406 and 408 limits "overtravel" in the docking process when the handler and test head are pushed together.

A matching hole is made in both the Outrigger PCB and the test head PCB and the first threaded fastening device 402 is inserted through the opening in the Outrigger PCB and securely fastened to the first threaded standoff 406, securely attaching the intermediate piece 410 perpendicular to the Outrigger PCB. The second threaded fastening device 404 is inserted through the opening in the test head PCB and securely fastened to the second standoff 408, securely attaching the intermediate piece 410 perpendicular to the test head PCB and securely attaching the test head PCB to the Outrigger PCB via the intermediate piece 410.

The process is repeated for each flex joint 206, 208, 210, 212, and 306, 308, 310 and 312. The resulting mechanical coupling of Outrigger PCB 202 and 302 to the test head 204, results in dual Outrigger PCBs held in a firm, flat position to accept the approaching handler PCB, yet the flex joints allow each Outrigger PCB to move when engaged by the tapered guide pins 108, 110, 112 and 114 and rapidly and accurately align the components on the Outrigger PCBs 202 and 302 with components on the handler PCB 106. Once aligned the high performance electrical connectors are then engaged until securely establishing an electrical connection between handler PCB and Outrigger PCB. The keyed guide pins insure the electrical connectors engage in only one position, eliminating the possibility of damage to the DUT due to an improper connection. The AC and DC signal path is established from the test head PCB to the Outrigger PCBs through controlled impedance AC cables and DC signal path wires with a high performance electrical interface estimated to 200 MHz AC and a potential for higher speeds with high performance RF connectors and cables.

Much larger docking "compliance" is available with the present invention relative to the hard docking method where compliance is defined as the amount of movement between the test head and handler that may be tolerated with no mechanical damage or interruption of electrical connections. The flexible docking apparatus can tolerate a much larger amount of movement between the test head and handler. For a hard docking set up, good compliance can be +/−20 Mils. Compliance is important, especially during temperature testing of devices during which hard docked mechanical components can expand and contract causing mechanical and/or electrical problems. Compliance is also important for protection during accidental movements which may occur between test head and handler. In the current soft docking solution, accidental bumps cause stress damage to sensitive test head components or the interface connectors. The flexible docking solution has an estimated compliance of +/−300 Mils and can easily tolerate temperature shifts and accidental movement between test head and handler.

Vibration isolation in the present invention is also improved. For very sensitive mixed signal components, such as 16 bit Analog-to-Digital converters, mechanical vibration between the test head and handler can effect electrical performance a great deal. The flexible docking solution provides excellent vibration isolation between the test head and handler, allowing improved testing accuracy for high resolution devices.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

We claim:

1. An electromechanical device suitable for use in flexible docking a test head and handler upon which electrical testing of a device under test electromechanically coupled to said handler occurs free of vibrations and component stress, wherein said device is comprised of:

a handler comprised of a first PCB having a plurality of offset guide pins, said handler further having a high performance contactor and first and third high performance electrical connectors;

a first Outrigger, said first Outrigger comprised of a second PCB having a first plurality of offset guide pin receptacles corresponding to said plurality of offset guide pins, said first Outrigger also having a second high performance electrical connector, said first Outrigger mechanically coupled to a test head via a first plurality of flex joints independent of a second Outrigger;

a second Outrigger, said second Outrigger comprised of a fourth PCB having a second plurality of offset guide pin receptacles corresponding to said plurality of offset guide pins, said second Outrigger also having a fourth high performance electrical connector, said second Outrigger mechanically coupled to said test head via a second plurality of flex joints independent of said first Outrigger;

a test head, said test head comprised of a third PCB electromechanically coupled to said first and second Outriggers via a plurality of controlled impedance AC cables, a plurality of DC cables and said first and said second plurality of flex joints, wherein one flex joint of said first plurality of flex joints is mechanically coupled perpendicular to each corner of said first Outrigger;

wherein said each flex joint of said first plurality of flex joints is comprised of, first and second threaded fasteners, first and second threaded standoffs and a cylindrical intermediate rubber piece, having first and second ends;

said first end of said intermediate piece placed securely over said first threaded standoff and said second end of said intermediate piece placed securely over said second threaded standoff, said intermediate piece bridging a gap between said first and second threaded standoff;

said first threaded fastener placed through a hole in said test head and securely fastened to said first threaded standoff, and securing said first threaded standoff and said first end of said intermediate piece perpendicular to said test head; and said second threaded fastener placed through a hole in said first Outrigger and securely fastened to said second threaded standoff, securing said second threaded standoff and said second end of said intermediate piece perpendicular to said first Outrigger.

2. A device as recited in claim 1 wherein one flex joint of said second plurality of flex joints is mechanically coupled perpendicular to each corner of said second Outrigger.

3. A device as recited in claim 1 wherein said first plurality of flex joints allows alignment between said handler and said first Outrigger during said flexible docking, said first plurality eliminating transmitted vibration between said test head and said handler while docked and said first plurality further eliminating stress on said first and second high performance electrical connectors during said flexible docking and while docked.

4. A device as recited in claim 3 wherein said first plurality of flex joints are independent of said second plurality of flex joints, said independence from said second plurality allowing said alignment between said handler and said first Outrigger free of stress from alignment between said handler and said second Outrigger.

5. A device as recited in claim 1 wherein said first PCB includes AC and DC signal traces, a high performance contactor and first and third high performance electrical connectors, said high performance contactor electrically coupled to said first and third high performance electrical connectors via said AC and DC signal traces.

6. A device as recited in claim 5 wherein said high performance contactor is used to hold the device under test.

7. A device as recited in claim 5 wherein said handler includes said plurality of offset guide pins, each guide pin of said plurality mechanically coupled perpendicular to said handler at each corner of said handler.

8. A device as recited in claim 7 wherein said plurality of offset pins are aluminum.

9. A device as recited in claim 1 wherein second PCB includes high speed AC and slow speed DC controlled impedance signal traces and a second high performance electrical connector, wherein said first Outrigger is mechanically independent of said second Outrigger.

10. A device as recited in claim 9 wherein said first Outrigger includes said first plurality of offset guide pin receptacles, each guide pin receptacle of said plurality mechanically coupled perpendicular to each end of said first Outrigger.

11. A device as recited in claim 10 wherein said first plurality of offset pin receptacles corresponds to said plurality of offset guide pins such that said plurality of offset pins will engage said first plurality of offset pin receptacles only when said handler is properly positioned.

12. A device as recited in claim 10 wherein said first plurality of offset pin receptacles are nylon.

13. A device as recited in claim 1 wherein said fourth PCB includes high speed AC and slow speed DC controlled impedance signal traces and a fourth high performance electrical connector, said second Outrigger mechanically independent of said first Outrigger.

14. A device as recited in claim 13 wherein said second Outrigger includes said second plurality of offset guide pin receptacles, each guide pin receptacle of said plurality mechanically coupled perpendicular to each end of said second Outrigger.

15. A device as recited in claim 14 wherein said second plurality of offset pin receptacles correspond to said plurality of offset guide pins such that said plurality of offset pins will engage said second plurality of offset pin receptacles only when said handler is properly positioned.

16. A device as recited in claim 14 wherein said second plurality of offset pin receptacles are nylon.

17. An electromechanical device suitable for use in flexible docking a test head and handler upon which electrical testing of a device under test electromechanically coupled to said handler occurs free of vibrations and component stress, wherein said device is comprised of:

a handler comprised of a first PCB having a plurality of offset guide pins, said handler further having a high performance contactor and first and third high performance electrical connectors;

a first Outrigger, said first Outrigger comprised of a second PCB having a first plurality of offset guide pin receptacles corresponding to said plurality of offset guide pins, said first Outrigger also having a second high performance electrical connector, said first Outrigger mechanically coupled to a test head via a first plurality of flex joints independent of a second Outrigger;

a second Outrigger, said second Outrigger comprised of a fourth PCB having a second plurality of offset guide pin receptacles corresponding to said plurality of offset guide pins, said second Outrigger also having a fourth high performance electrical connector, said second Outrigger mechanically coupled to said test head via a second plurality of flex joints independent of said first Outrigger;

a test head, said test head comprised of a third PCB electromechanically coupled to said first and second Outriggers via a plurality of controlled impedance AC cables, a plurality of DC cables and said first and said second plurality of flex joints, wherein one flex joint of said second plurality of flex joints is mechanically coupled perpendicular to each corner of said second Outrigger;

first and second threaded fasteners, first and second threaded standoffs and a cylindrical intermediate rubber piece, having first and second ends;

said first end of said intermediate piece placed securely over said first threaded standoff and said second end of said intermediate piece placed securely over said second threaded standoff, said intermediate piece bridging a gap between said first and second threaded standoff;

said first threaded fastener placed through a hole in said test head and securely fastened to said first threaded standoff, and securing said first threaded standoff and said first end of said intermediate piece perpendicular to said test head; and said second threaded fastener placed through a hole in said second Outrigger and securely fastened to said second threaded standoff, securing said second threaded standoff and said second end of said intermediate piece perpendicular to said second Outrigger.

18. A device as recited in claim 17 wherein said second plurality of flex joints allows alignment between said handler and said second Outrigger during said flexible docking, said second plurality eliminating transmitted vibration between said test head and said handler while docked and said second plurality further eliminating stress on said third and fourth high performance electrical connectors during said flexible docking and while docked.

19. A device as recited in claim 18 wherein said second plurality of flex joints are independent of said first plurality of flex joints, said independence from said first plurality allowing said alignment between said handler and said second Outrigger free of stress from said alignment between said handler and said first Outrigger.

* * * * *